United States Patent [19]

Bayerer

[11] Patent Number: 5,773,320
[45] Date of Patent: Jun. 30, 1998

[54] METHOD FOR PRODUCING A POWER SEMICONDUCTOR MODULE

[75] Inventor: Reinhold Bayerer, Reichelsheim, Germany

[73] Assignee: Asea Brown Boveri AG, Baden, Switzerland

[21] Appl. No.: 558,022

[22] Filed: Nov. 13, 1995

[51] Int. Cl.$^6$ .................................................. H01L 21/60
[52] U.S. Cl. ........................................... 438/107; 438/108
[58] Field of Search ................................... 437/205, 206, 437/207, 208, 209, 214, 217, 219, 220; 438/107, 108

[56] References Cited

U.S. PATENT DOCUMENTS

| | | | |
|---|---|---|---|
| 3,769,702 | 11/1973 | Scarbrough | 437/208 |
| 3,868,765 | 3/1975 | Hartleroad et al. | 437/220 |
| 4,709,468 | 12/1987 | Wilson | 437/205 |
| 4,859,631 | 8/1989 | Barre | 437/218 |
| 5,134,340 | 7/1992 | Haitz | 437/205 |
| 5,371,043 | 12/1994 | Anderson et al. | 437/219 |
| 5,403,784 | 4/1995 | Hashemi et al. | 437/220 |
| 5,490,324 | 2/1996 | Newman | 437/207 |
| 5,492,842 | 2/1996 | Eytcheson et al. | 437/209 |
| 5,556,807 | 9/1996 | Bhattacharyya et al. | 437/209 |
| 5,589,402 | 12/1996 | Ramsey et al. | 437/207 |

FOREIGN PATENT DOCUMENTS 0 597 144   5/1994   European Pat. Off. .

Primary Examiner—Kevin Picardat
Attorney, Agent, or Firm—Oblon, Spivak, McClelland, Maier & Neustadt, P.C.

[57] ABSTRACT

In the case of a method for producing a power semiconductor module (10), in which a plurality of submodules (12) are arranged on a common support (11), are interconnected by means of a multilayer laminate made of metal layers (13–15) and insulating layers (16, 17), which layers are layered alternately one above the other, and can be externally connected, reliable production of the laminate is achieved by virtue of the fact that in order to construct the laminate, the individual metal layers (13–15) and insulating layers (16, 17) are stacked one above the other, are aligned with one another and with respect to the support (11) by means of auxiliary alignment means (18, 19) and are interconnected in the aligned state by techniques such as welding, soldering or bonding.

8 Claims, 2 Drawing Sheets

METHOD FOR PRODUCING A POWER SEMICONDUCTOR MODULE

TECHNICAL FIELD

The present invention is concerned with the field of power electronics. It relates to a method for producing a power semiconductor module, in which a plurality of submodules are arranged on a common support, are interconnected by means of a multilayer laminate made of metal layers and insulating layers, which layers are layered alternately one above the other, and can be externally connected.

PRIOR ART

Such a method is disclosed, for example, in the publication EP-A1-0 597 144.

Modules according to the publication cited in the introduction are constructed from individual submodules which are electrically and thermally interconnected and externally connected by means of a layer sequence essentially comprising planar insulating layers, conductive plates or metal layers as well as heat sinks and other supplementary elements. These different layers are alternately stacked onto one another on a support and are joined together, for example by adhesive bonding, to form a fixed laminate. The adhesive is applied by dispersion, screen printing or similar methods to the bonding surfaces of the layers to be adhesively bonded. The layers are then stacked onto one another with the adhesive still in its liquid form. Curing takes place after this.

What is problematic here is that the individual layers with the adhesive still in its liquid form can slip as they are being stacked onto one another, with the result that the contact-making of the semiconductor elements may be contaminated and the outer contacts may no longer be in the desired position.

DESCRIPTION OF THE INVENTION

The object of the invention, therefore, is to provide a method for producing such a power semiconductor module, in which the completion of the laminate is ensured in a simple manner without the individual layers slipping.

The object is achieved, in the case of a method of the type mentioned in the introduction, by virtue of the fact that in order to construct the laminate, the individual metal layers and insulating layers are stacked one above the other, are aligned with one another and with respect to the support by means of auxiliary alignment means and are interconnected in the aligned state by techniques such as welding, soldering or bonding. The use of auxiliary alignment means permits reliable and permanent alignment of the layers during connection, without it being necessary substantially to change the layers themselves. Moreover, it is possible to configure the auxiliary alignment means to be capable of being removed, so that they can be removed following completion of the laminate and not interfere with the further module construction.

According to a first preferred exemplary embodiment of the method according to the invention, the auxiliary alignment means are arranged on the side edges of the laminate, and, furthermore, the metal layers are designed to be set back with respect to the adjacent insulating layers at those side edges on which the auxiliary alignment means are arranged, and the auxiliary alignment means comprise additional means which make it possible to align the metal layers which are set back at the edge-side auxiliary alignment means. By arranging the auxiliary alignment means on the edges, the interference in the laminate due to the auxiliary alignment means is kept low. The setting back of the metal layers and their alignment by the additional means ensure high insulation (voltage strength>1000 V) at the edge side between the layers which are at different potentials, as is indispensable for power semiconductor modules.

A further preferred embodiment of the method according to the invention is characterized in that use is made of auxiliary alignment means which can be removed following completion of the laminate. In this way, there are no interfering additional alignment parts in the finished module.

Removable auxiliary alignment means can be realized in a particularly simple manner if, according to a further embodiment, the auxiliary alignment means comprise alignment pins which can be inserted into corresponding bores in the support, and if the additional means comprise spacer washers which can be put onto the alignment pins and have a thickness which is approximately equal to the thickness of the associated metal layers.

Alternatively, however, use can also be made of alignment means which are permanently connected to the support and thus remain permanently integrated in the finished module, in which case, in particular, vertical side walls are fitted to the support, and the alignment means comprise vertical alignment webs which are fitted to the inner side of the side walls.

Further embodiments emerge from the dependent claims.

BRIEF EXPLANATION OF THE FIGURES

The invention will be explained in more detail below using exemplary embodiments in connection with the drawing, in which.

WAYS OF IMPLEMENTING THE INVENTION

Figure 1:
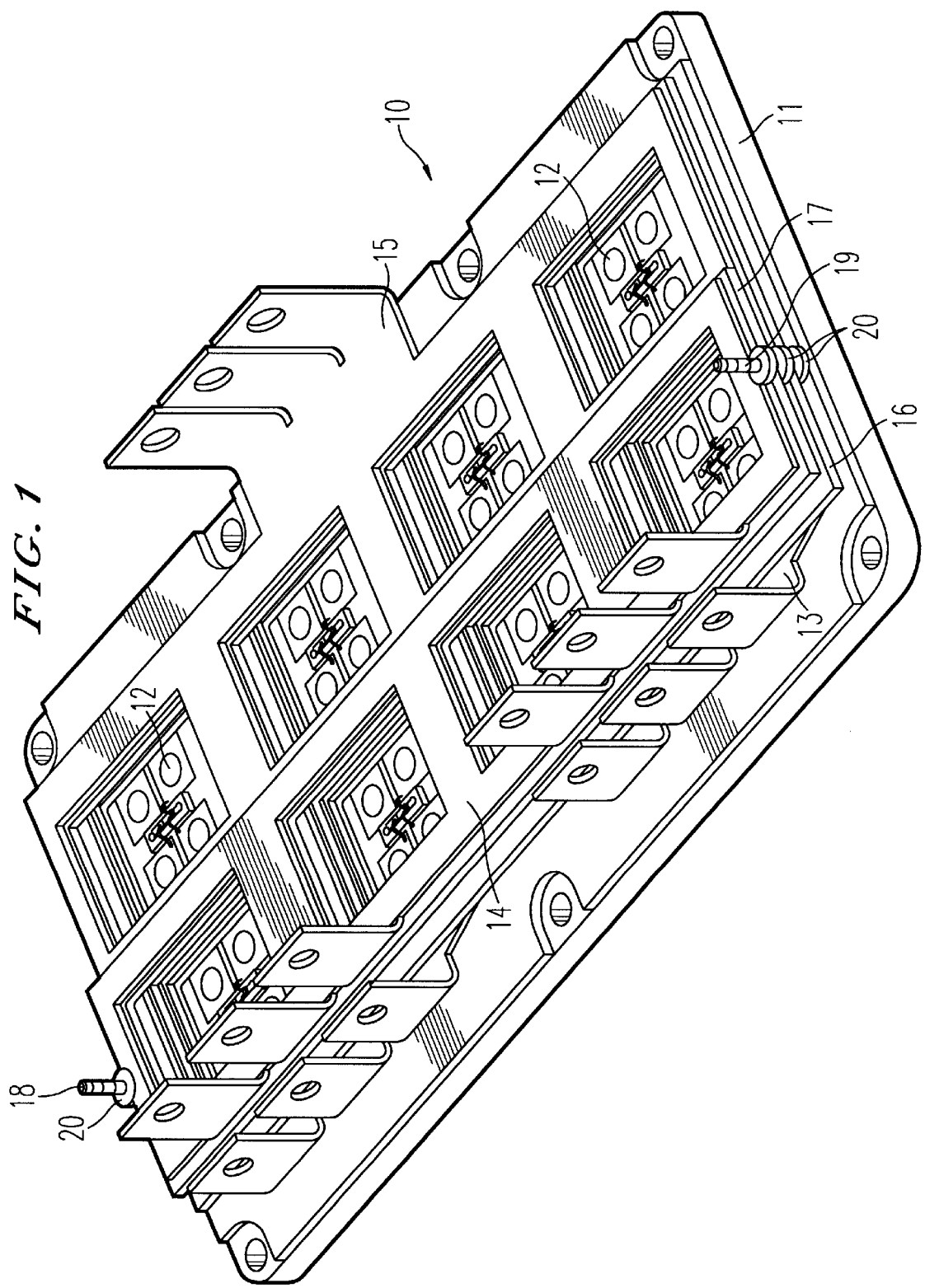
FIG. 1 shows a perspective, half-opened illustration of a first preferred exemplary embodiment of a power semiconductor module having removable auxiliary alignment means for producing the laminate.

FIG. 1 represents a perspective, half-opened illustration of an exemplary embodiment of a power semiconductor module in the voltage region of 2500 V having removable auxiliary alignment means. On a common baseplate 11 (made of Cu), the power semiconductor module 10 comprises a plurality of submodules 12 which are arranged next to one another and are connected or can be connected to one another and externally by means of a laminate comprising a plurality of metal layers 13, 14 and 15 and insulating layers 16, 17 lying in between. The external connection takes place via corresponding multiple tabs which are bent upwards and are integrally formed on the metal layers 13, 14 and 15. For their part, the submodules 12 contain individual semiconductor elements such as, for example, IGBTs or diodes in the form of chips which are interconnected and are connected to the laminate.

Bores (not visible in FIG. 1) are arranged in the baseplate 11 at the transverse edges of the laminate, into which bores two alignment pins 18, 19 are inserted or press-fitted. The alignment pins are made of a plastic material (for example Teflon, Delrin and the like) to which the adhesive which is used for the production of the laminate cannot adhere.

Therefore, the alignment pins can easily be pulled out of the bores in the baseplate 11 after the bonds have cured, and as a result do not interfere in the further completion of the module.

The side edges of the insulating layers 16 and 17 are situated directly in the region of the alignment pins 18, 19. Said layers are provided at these points with holes or U-shaped cutouts which are matched in diameter, with the result that they can slip with their edges over the alignment pins 18, 19 and be held in position by the alignment pins 18, 19. Since the metal layers 13, 14, 15 have to be set back at all points by about 1 mm from the edge of the insulating layers 16, 17 in order to ensure the insulation from high voltages (>1000 V), said layers cannot be guided directly by the (relatively thin) alignment pins 18, 19. For the alignment of the metal layers 13–15, therefore, the edges thereof are provided with holes or U-shaped cutouts, which are 2 mm larger in diameter, in the region of the alignment pins 18, 19. The metal layers are then aligned by additional means in the form of spacer washers 20 which are pushed over the alignment pins 18, 19. The spacer washers are preferably made of the same material as the alignment pins 18, 19. They have approximately the same thickness as the metal layers and are matched in diameter to the holes or U-shaped cutouts in the metal layers. In this way, it is now possible for a plurality of insulating layers 16, 17 and metal layers 13–15 to be stacked alternately onto one another and aligned.

After the adhesive bond has cured, the alignment pins 18, 19 are then pulled out of the baseplate 11. As a result, the spacer washers 20 also become free and can be removed. By removing the alignment pins 18, 19 and spacer washers 20, the alignment region becomes free for the sealing of the module. This ensures that the insulation in the edge region is guaranteed.

Figure 2:
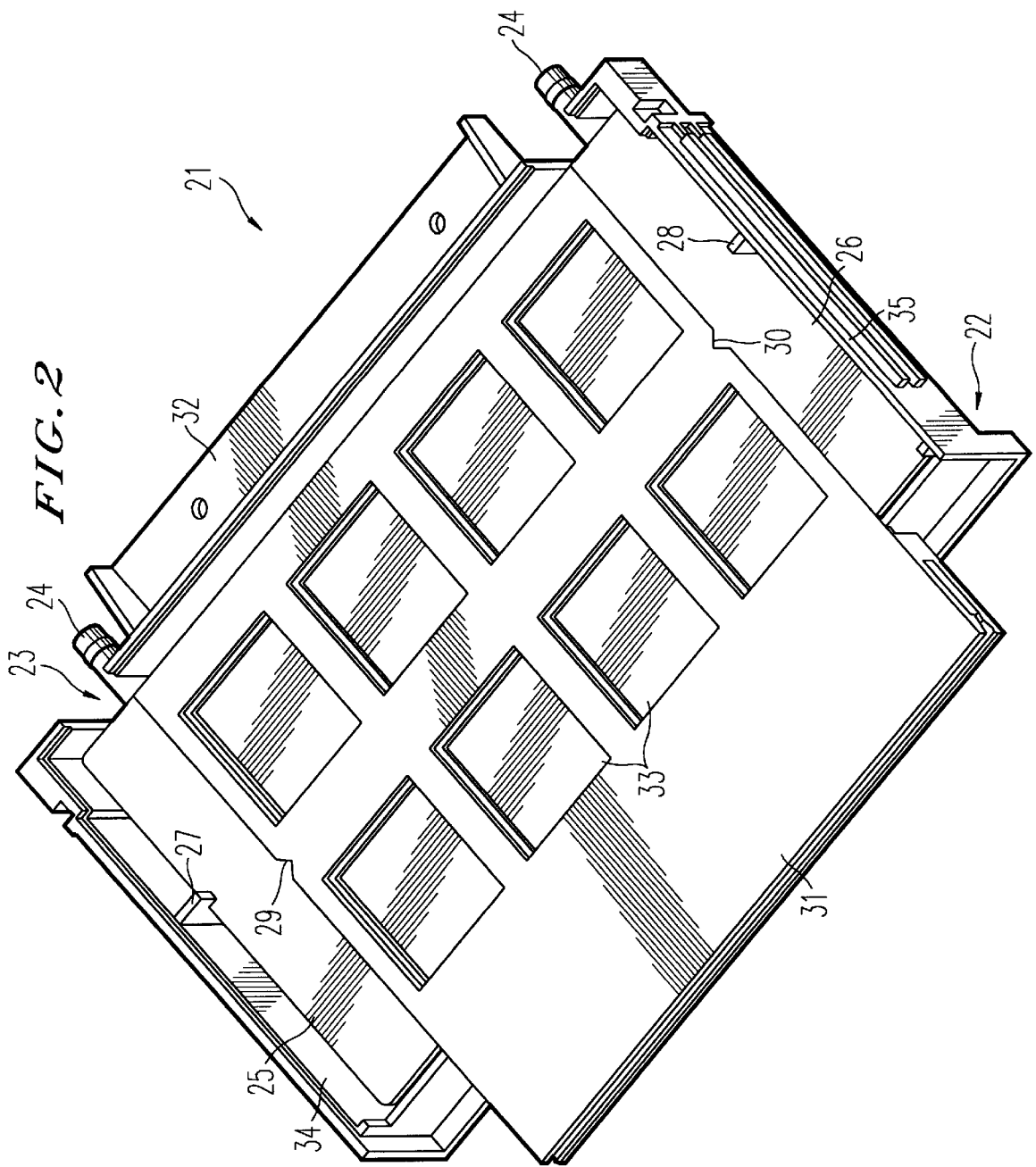
FIG. 2 shows a comparable illustration of a second preferred exemplary embodiment of a power semiconductor module having permanently integrated auxiliary alignment means.

FIG. 2 shows a further exemplary embodiment in the form of a module having permanently integrated auxiliary alignment means. The interior of the power semiconductor module 21, which is designed for a voltage of 4500 V, is constructed in such a way that the lower half of the module, the lower part 22 with the integrally formed fastening strip 32, simultaneously serves as a carrier for the mounting of the layers onto one another. At its transverse sides, the lower part 22 has vertical side walls 34, 35, on the inner side of which vertical alignment webs 27, 28 are integrally formed. The alignment webs 27, 28 match corresponding recesses in the cooling element 23 (with its cooling element connections 24) which is incorporated (at the bottom) and the insulating layers (not shown in FIG. 2). The cooling element 23, the insulating layers and the top printed circuit board (likewise not shown) for the wiring of the auxiliary connections are directly aligned by the alignment webs 27, 28.

The metal layers (one metal layer 31 with recesses 33 for the submodules is shown in FIG. 2) are again incorporated with a spacing from the edges of the insulating layers. In order nevertheless to ensure their alignment, flat spacers 25, 26 (2 for each metal layer) in the form of plates and made of insulating material are provided as additional means, which spacers have on their outer edges, in the same way as the insulating layers, recesses matching the alignment webs 27, 28 on the side walls 34, 35. On their inner edges, the spacers 25, 26 guide the metal layers 31 by means of further alignment markings. Therefore - as shown in FIG. 2—alignment tongues 29, 30 which engage into corresponding recesses on the side edges of the metal layers 31 may be integrally formed, for example, on the inner edges of the spacers 25, 26. However, conversely, it is also possible for the alignment tongues to be arranged on the edges of the metal layers and for the associated recesses to be arranged on the inner edges of the spacers 25, 26.

The spacers 25, 26 have approximately the same thickness as the associated metal layers and are situated with them in the same plane. They remain—just like the alignment webs 27, 28—incorporated in the module and are adhesively bonded to the other parts in such a way that there is no creepage path from metal layer to metal layer at different potentials. In this case, too, it is therefore ensured that the individual layers of the laminate to be produced remain aligned and fixed up to the point of curing.

LIST OF DESIGNATIONS

10, 21 Power semiconductor module
11 Baseplate
12 Submodule
13, 14, 15 Metal layer
16, 17 Insulating layer
18, 19 Alignment pin
20 Spacer washer
22 Lower part
23 Cooling element
24 Cooling element connection
25, 26 Spacer
27, 28 Alignment web
29, 30 Alignment tongue
31 Metal layer
32 Fastening strip
33 Recess (for submodule)
34, 35 side wall

I claim:

1. A method for producing a power semiconductor module in which a plurality of submodules are arranged on a common support and are interconnected by means of a multilayer laminate made of metal layers and insulating layers which are arranged alternately one above the other, said multilayer laminate also providing for external connections, said method comprising the steps of:

arranging an auxiliary alignment structure with respect to the common support, said auxiliary alignment structure including separate metal layer alignment elements;

stacking and aligning a first metal layer with respect to one of the metal layer alignment elements of the auxiliary alignments structure arranged on the common support;

stacking and aligning an insulating layer over the aligned first metal layer using the auxiliary alignment structure so that an aligned side of the first metal layer aligned by said one of the metal layer alignment elements is set back from an aligned side of the insulating layer aligned by said auxiliary alignment structure;

stacking and aligning a further metal layer over the insulating layer using another one of the metal layer alignment elements of the auxiliary alignment structure so that the further metal layer has an aligned side set back from the aligned side of the insulating layer in the same manner that the aligned side of the first metal layer is set back from the aligned side of the insulating layer;

fastening the stacked layers together to form the multilayer laminate.

2. The method according to claim 1, wherein the steps of stacking and aligning an insulating layer and stacking and aligning a further metal layer are alternately repeated a desired number of times to form a multilayer laminate with a desired number of layers.

3. The method according to claim 2, further including the step of removing the auxiliary alignment structure from the common support after the multilayer laminate has been completely formed.

4. The method according to claim 3, wherein the step of arranging the auxiliary alignment structure with respect to the common support includes inserting alignment pins into corresponding bores provided in the common support.

5. The method according to claim 4, further comprising the steps of arranging spacer washers on the alignment pins which have a thickness which is approximately equal to a thickness of the metal layers as said metal layer alignment elements.

6. The method according to claim 2, wherein the arranging of the auxiliary alignment structure on the common support is a permanent arrangement.

7. The method according to claim 6, wherein the permanent arrangement includes vertical side walls on the common support and the step of arranging the auxiliary alignment structure includes providing alignment webs fixed to the inner side of the side walls.

8. The method according to claim 7, further comprising the step of providing spacer plates of approximately a metal layer thickness as said metal layer alignment elements.

* * * * *